(12) United States Patent
Schultz

(10) Patent No.: US 8,736,048 B2
(45) Date of Patent: May 27, 2014

(54) FLEXIBLE HEAT SINK WITH LATERAL COMPLIANCE

(75) Inventor: Mark D. Schultz, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/398,534

(22) Filed: Feb. 16, 2012

(65) Prior Publication Data

US 2013/0214406 A1  Aug. 22, 2013

(51) Int. Cl.
*H01L 23/36* (2006.01)

(52) U.S. Cl.
USPC ............ 257/713; 257/E23.102; 257/E23.068; 257/E21.506; 257/E23.01; 257/685; 257/723; 257/686; 257/706; 257/707; 257/679; 257/690; 257/712

(58) Field of Classification Search
USPC ......... 257/685, 723, 686, 706, 707, 712, 713, 257/679, 693, 675, E23.068, E21.506, 257/E23.01, 690
See application file for complete search history.

(56) References Cited

U.S. PATENT DOCUMENTS

| | | | | |
|---|---|---|---|---|
| 5,109,317 A | * | 4/1992 | Miyamoto et al. | 361/715 |
| 5,168,348 A | * | 12/1992 | Chu et al. | 257/713 |
| 5,592,735 A | * | 1/1997 | Ozawa et al. | 29/842 |
| 5,963,427 A | * | 10/1999 | Bollesen | 361/704 |
| 5,981,310 A | * | 11/1999 | DiGiacomo et al. | 438/106 |
| 6,027,958 A | * | 2/2000 | Vu et al. | 438/110 |
| 6,373,133 B1 | * | 4/2002 | DiGiacomo et al. | 257/713 |
| 6,956,284 B2 | * | 10/2005 | Cady et al. | 257/685 |
| 6,980,438 B2 | * | 12/2005 | Huang et al. | 361/719 |
| 7,787,254 B2 | * | 8/2010 | Clayton et al. | 361/749 |
| 7,806,168 B2 | * | 10/2010 | Upadhya et al. | 165/80.4 |
| 2006/0012034 A1 | * | 1/2006 | Kadoya et al. | 257/712 |
| 2008/0170366 A1 | * | 7/2008 | Campbell et al. | 361/699 |
| 2008/0225484 A1 | * | 9/2008 | Brodsky et al. | 361/699 |
| 2009/0065925 A1 | * | 3/2009 | Bernstein et al. | 257/690 |
| 2011/0031610 A1 | * | 2/2011 | Yamazaki et al. | 257/693 |

* cited by examiner

*Primary Examiner* — Alexander O Williams
(74) *Attorney, Agent, or Firm* — Robert J. Eichelburg; The Law Offices of Robert J. Eichelburg

(57) ABSTRACT

A multi-chip module (MCM) structure comprises more than one semiconductor chip lying in a horizontal plane, the MCM having individual chip contact patches on the chips and a flexible heat sink having lateral compliance and extending in a plane in the MCM and secured in a heat exchange relation to the chips through the contact patches. The MCM has a mismatch between the coefficient of thermal expansion of the heat sink and the MCM and also has chip tilt and chip height mismatches. The flexible heat sink with lateral compliance minimizes or eliminates shear stress and shear strain developed in the horizontal direction at the interface between the heat sink and the chip contact patches by allowing for horizontal expansion and contraction of the heat sink relative to the MCM without moving the individual chip contact patches in a horizontal direction.

10 Claims, 6 Drawing Sheets

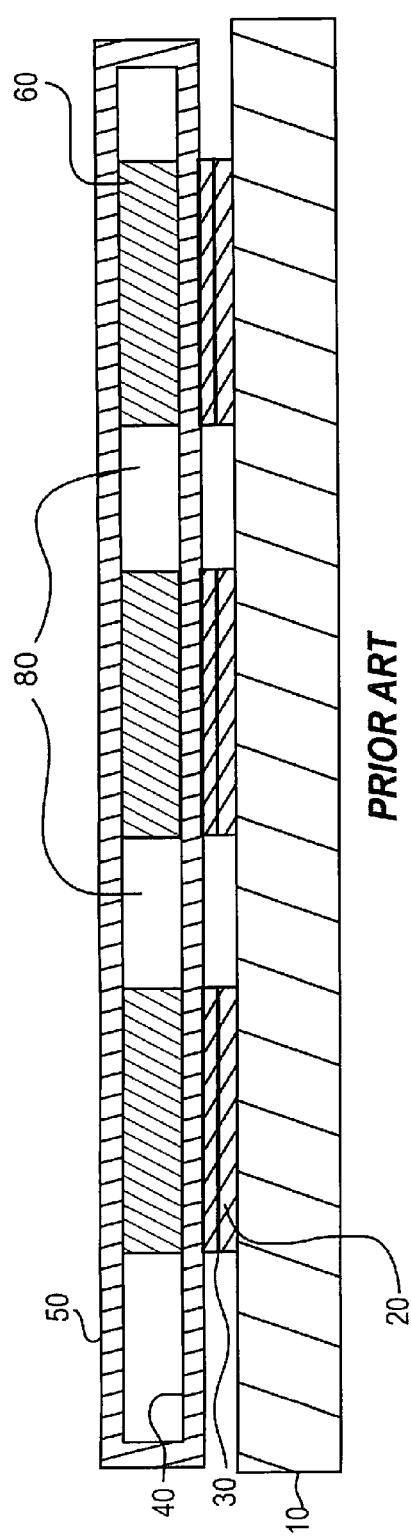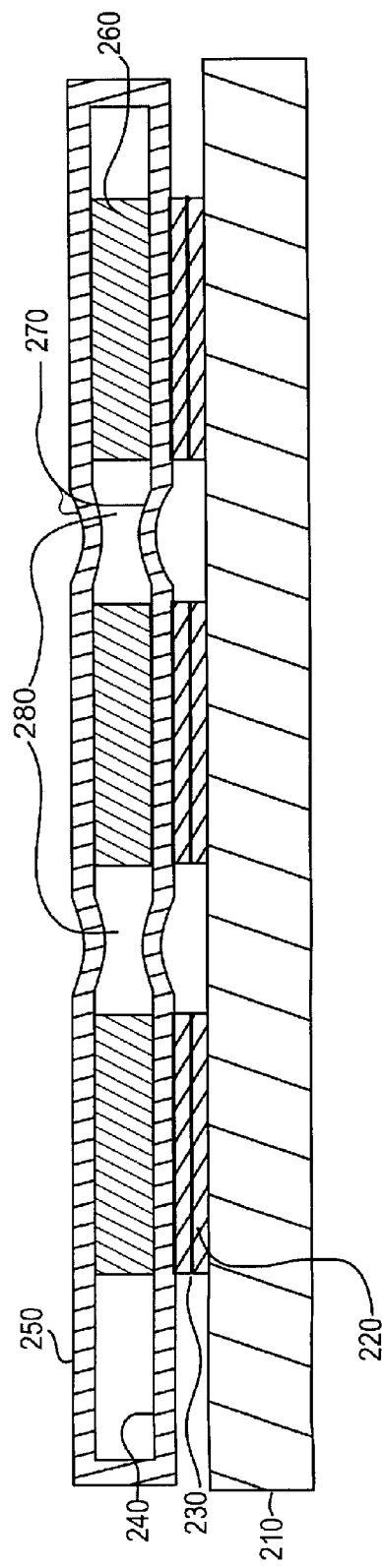
PRIOR ART
FIG. 1
FIG. 2

FLEXIBLE HEAT SINK WITH LATERAL COMPLIANCE

FIELD OF THE INVENTION

The filed of the invention in one aspect comprises a flexible heat sink with lateral compliance

BACKGROUND OF THE INVENTION

The so-called "silicon revolution" brought about the development of faster and larger computers beginning in the early 1960's with predictions of rapid growth because of the increasing numbers of transistors packed into integrated circuits with estimates they would double every two years. Since 1975, however, they doubled about every 18 months.

An active period of innovation in the 1970's followed in the areas of circuit design, chip architecture, design aids, processes, tools, testing, manufacturing architecture, and manufacturing discipline. The combination of these disciplines brought about the VLSI era and the ability to mass-produce chips with 100,000 transistors per chip at the end of the 1980's, succeeding the large scale Integration ("LSI") era of the 1970's with only 1,000 transistors per chip. (Carre, H. et al. "Semiconductor Manufacturing Technology at IBM", IBM J. RES. DEVELOP., VOL. 26, no. 5, September 1982). Mescia et al. also describe the industrial scale manufacture of these VLSI devices. (Mescia, N.C. et al. "Plant Automation in a Structured Distributed System Environment," IBM J. RES. DEVELOP., VOL. 26, no. 4, July 1982).

The release of IBM's Power6™ chip in 2007, noted "miniaturization has allowed chipmakers to make chips faster by cramming more transistors on a single slice of silicon, to the point where high-end processors have hundreds of millions of transistors. But the process also tends to make chips run hotter, and engineers have been trying to figure out how to keep shrinking chips down while avoiding them frying their own circuitry." (http://www.nytimes.com/reuters/technology/tech-ibm-power.html?pagewanted=print (Jul. 7, 2006))

Technology scaling of semiconductor devices to 90 nm and below has provided many benefits in the field of microelectronics, but has introduced new considerations as well. While smaller chip geometries result in higher levels of on-chip integration and performance, higher current and power densities, increased leakage currents, and low-k dielectrics with poorer heat conductivity occur that present new challenges to package and heat dissipation designs.

Thus CMOS power density is increasing. Recently the industry has seen it rise from100 W/sq cm to 200 W/sq cm, beyond that of bipolar technology in the early 1990's. This increase in power density also increases the operating temperature of the device.

Compliant heat sinks which cover more than one semiconductor chip on a multi-chip module (MCM) have often been proposed as a cooling solution for such modules. As there is generally a mismatch between the coefficient of thermal expansion (CTE) of the heat sink and the MCM, shear stress and/or strain can develop in the interface between the heat sink and the chips, as the "compliant" heat sinks generally are only significantly compliant in the vertical (perpendicular to the chip faces) direction to accommodate chip tilt and/or height mismatch. This stress and/or strain is typically absorbed by a low-modulus thermal interface material (TIM) used to connect the heat sink to the chips on the MCM.

These "compliant" heat sinks generally are not significantly compliant in the horizontal (parallel to the chip faces) direction and as a result do not adequately address shear stress and/or strain developed horizontally in the interface between the heat sink and the chips.

When a rigid or semi-rigid TIM such as a stiff gel, Indium, or solder is used as a heat sink, it can fail under thermal cycling due to this stress/strain. Thermal greases employed to connect chip components to conventional heat sinks heat sinks do not provide a complete solution to the problem since their heat conductivity is at best about 4.5 W/m K. These greases function by loading thermally conducting particles such as copper, silver, carbon nanotubes or other materials into the grease to lower its inherent thermal resistance, however, a common problem of this approach lies in effecting thermal conduction between the particles via proximity of the particles to one another. The particles are neither chemically nor metallurgically bonded to one another therefore high thermal resistance is invariably present in these interface materials. The TIM material typically would sit underneath "contact patches," in the device being cooled, helping to thermally bridge the gap between the device and the "contact patches" Movement of the two surfaces interfacing with the grease therefore can "pump" the grease out of the interface, resulting in failure of the interface.

RELATED ART

Shirikami et al., U.S. Pat. No. 7,663,883, show a heat transfer mechanism for dissipating heat from a heat generating body to a heat dissipating part, but do not show elements for relieving lateral stress between separate heat removal areas.

Thompson et al., U.S. Pat. No. 7,646,608, illustrate an apparatus for coupling a heat-generating device to a heat-removing device, but does not show elements for relieving lateral stress between separate heat removal areas.

Han et al., U.S. Pat. No. 7,443,678, show a circuit board with heat dissipation ability, but do not show elements for relieving lateral stress between separate heat removal areas.

Farrow et al., U.S. Pat. No. 7,200,006, illustrate a metallic sheet to bridge a gap between a top surface of a processor package and a bottom surface of a heat sink. The sheet is positioned between the processor package and heat sink before securing the heat sink to the processor package, but do not show elements for relieving lateral stress between separate heat removal areas.

Gelormeet al., U.S. Pat. No. 7,063,127, show thermal interface enclosure apparatus adapted to be placed between an IC chip and a heat sink to enhance heat transfer from the chip to the heat sink, but do not show areas or elements for relieving lateral stress between separate heat removal areas.

Sen et al., U.S. Pat. No. 7,007,741, illustrate a heat spreader apparatus for cooling an electronic component but do not show elements for relieving lateral stress between separate heat removal areas.

Herbert, U.S. Pat. No. 6,549,411, shows a flexible heat sink and/or object from which heat is to be removed that may have significant flexibility, but does not show elements for relieving lateral stress between separate heat removal areas.

McCullough, U.S. Pat. No. 6,367,541, illustrates a heat sink assembly for removing heat from heat generating components, but does elements for relieving lateral stress between separate heat removal areas.

Kelley, U.S. Pat. No. 6,131,646, shows a heat conductive interface, a heat generating device and a support platform, but does not illustrate elements for relieving lateral stress between separate heat removal areas.

Harris et al., U.S. Pat. No. 5,794,454, illustrate a mechanism for cooling high-powered electronic circuit chip modules which cannot otherwise be cooled by conventional means because of their non-coplanarity and their inaccessibility, but do not elements for relieving lateral stress between separate heat removal areas.

Chu et al., U.S. Pat. No. 5,168,348, show a heat sink arranged to extract heat from an array of computer chips in an electric module, but do not illustrate elements for relieving lateral stress between separate heat removal areas.

Flint et al., U.S. Pat. No. 4,964,458, show a heat exchanger for cooling an array of electric circuit chips disposed on a common substrate do not, but do not address or a thermal interface material with limited ability to absorb shear forces.

SUMMARY OF THE INVENTION

The present invention provides structures, articles of manufacture and processes that address these needs to not only provide advantages over the related art, but also to substantially obviate one or more of the foregoing and other limitations and disadvantages of the related art by providing a flexible heat sink with lateral compliance. Incorporating lateral compliance into a vertically flexible/compliant heat sink allows CTE driven strain to be absorbed by the heat sink rather than the TIM for stiff TIM materials.

Not only do the written description, claims, and abstract of the disclosure set forth various features, objectives, and advantages of the invention and how they may be realized and obtained, but these features, objectives, and advantages will also become apparent by practicing the invention.

BRIEF DESCRIPTION OF THE DRAWINGS

The accompanying drawings are not necessarily drawn to scale but nonetheless set out the invention, and are included to illustrate various embodiments of the invention, and together with this specification also serve to explain the principles of the invention. These drawings comprise various Figures that illustrate, inter alia, flexible heat sink structures having lateral compliance FIG. 1 is a side elevation in cross section illustrating a prior art structure for cooling an MCM and consists of a thin bottom metal sheet, a thin top metal sheet and heat transfer elements (HTM) separating them. The metal sheets in this structure do not have lateral compliance features.

FIG. 2 Illustrates the present invention comprising a side elevation in cross-section of a structure for cooling an MCM and comprises a thin bottom thermally conductive sheet, a thin top thermally conductive sheet and heat transfer elements (HTM) separating them. The thermally conductive sheets in this structure include lateral compliance features comprising bends in the thermally conductive sheets.

DETAILED DESCRIPTION OF THE INVENTION

Figure 3:
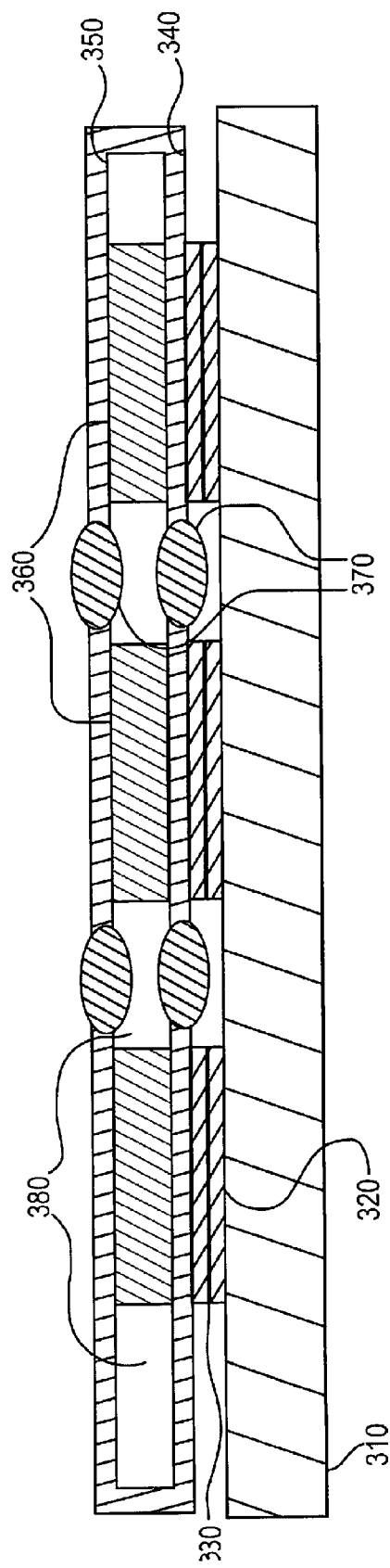
FIG. 3 Illustrates the present invention comprising a side elevation in cross-section of a structure for cooling an MCM and comprises separate thin thermally conductive sheets at the bottom of the structure, and separate thin thermally conductive sheets at the top of the structure and heat transfer elements (HTM) separating the thin thermally conductive sheets. The thermally conductive sheets in this structure include lateral compliance features comprising an elastomer that joins them along their horizontal edges.

To achieve the foregoing and other advantages, and in accordance with the purpose of this invention as embodied and broadly described herein, the following detailed description comprises disclosed examples of the invention that can be embodied in various forms.

The specific processes, compounds, compositions, and structural details set out herein not only comprise a basis for the claims and a basis for teaching one skilled in the art to employ the present invention in any novel and useful way, but also provide a description of how to make and use this invention. The written description, claims, abstract of the disclosure, and the drawings that follow set forth various features, objectives, and advantages of the invention and how they may be realized and obtained. These features, objectives, and advantages will also become apparent by practicing the invention.

The invention comprises a flexible heat sink extending in a plane in an MCM where the heat sink comprises a thermally conductive sheet having lateral compliance.

The heat sink is made from a thin thermally conductive sheet, e.g., a metal sheet from about 100 micrometers to about 350 micrometers thick. Flexible sheets thinner or thicker than this are possible, but this would be a typical range. Although we describe the sheet as being made from a metal such as Cu, Al, Au, Ag, combinations thereof and alloys thereof, and the like, for the purpose of this invention, "thermally conductive" is also intended to include graphene or carbon nanotubes, both of which are commercially available in sheet form. Other materials for MCM cooling in this regard comprise any other thermally conductive mechanically flexible material.

A structure provided according to the invention comprises a heat sink having a thin top sheet which may or may not be thermally conductive and a thin bottom thermally conductive sheet with heat transfer elements separating them to form a gap between the two. Cooling fluids, such as gases or liquids known in the art can be circulated or passed through this gap. Thin top and bottom sheets provide flexibility to accommodate tilted chips and level differences between chips. Adding lateral compliance features to at least the bottom (chipside) sheet allows for lateral expansion and contraction of the heat sink relative to the substrate without substantially moving or substantially stressing the individual chip contact patches. In one instance the lateral compliance feature comprise a bend in the thermally conductive sheet; in another it comprises an elastomer joining the horizontal edges of two or more of these sheets.

Flexible cold plates with lateral compliance features can absorb CTE-driven strain and stress in the cold plate rather than in the TIM.

Lateral compliance features can also improve the flexibility of the flexible cold plate by disconnecting the linked parallel plate structure present in "standard" flexible cold plate designs. With linked parallel plate structures as shown in FIG. 1, neighboring heat transfer elements 60 can be constrained to be essentially parallel to each other even if the elements end up at different vertical locations. Lateral compliance features in both top and bottom sheets remove this constraint.

Figure 5:
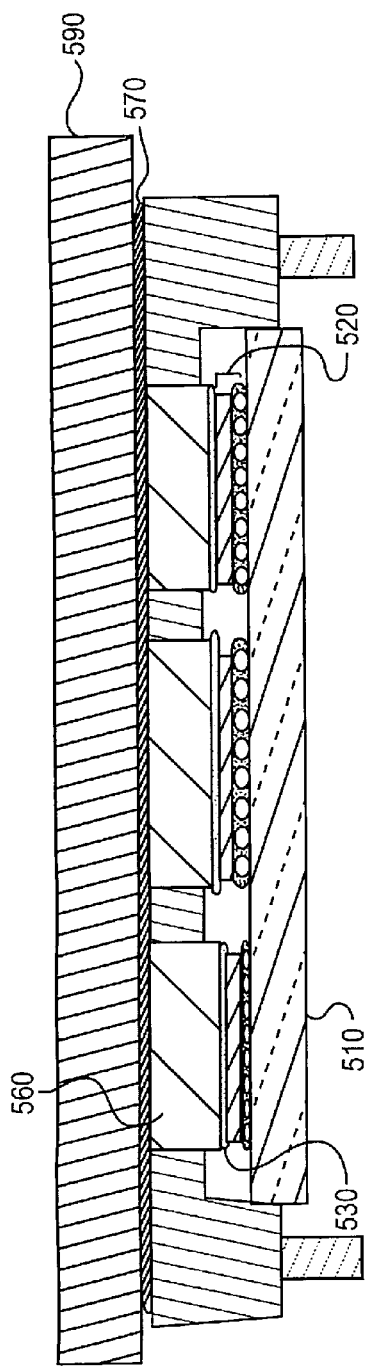
FIG. 5 is a side elevation in cross section of a structure for cooling an MCM consisting of a prior art rigid cold plate assembly associated with a cooling/chip structure as illustrated in FIG. 1.

The invention will reduce the cost of an MCM by eliminating the second heat spreader seen in some prior art cooling solutions such as cold plate 590 in FIG. 5, and expand material selections for MCM cooling.

By adding lateral compliance features to the flexible heat sink we allow movement of the heat sink surface attached or semi-attached to one chip site relative to the surface attached to another chip site. This allows "direct attach" using a TIM such as indium without requiring the indium to absorb chip-to-chip driven strains and stresses. A TIM material would sit between the chip contact patch of the heat sink and the heat sink itself as in FIG. 6. TIMs in addition to indium can be used such as silicone gels, thermal pastes, other solders (e.g. Pb/Sn), thermal epoxies, thermal pads, graphite sheets or pads. "Semi-attached" as distinguished from "direct attach." refers to softer TIM's like silicone gels which allow for some movement of the interface without necessarily degrading the interface Referring to the drawings, FIG. 1 is an illustration of a prior art heat sink without lateral compliance consisting of a substrate 10 of a MCM device with semiconductor chips 20 terminating in chip contact patches 30. A thin metal heat sink sheet 40 extends in a plane over the chips 20 and is secured to chips 20 through chip contact patches 30. typically utilizing a thermal interface material (TIM, [not shown) Heat transfer elements (HTE) 60 such as fins, pins or other heat transfer structures are mounted on heat sink sheet 40 and support a thin metal heat sink sheet 50. Heat sink material 40, HTE 60, and heat sink material 50 define channels 80 through which a cooling fluid or heat exchange fluid flows to carry away any heat developed in the MCM. Typical fluids would include water and air.

FIG. 2 comprises an illustration of a heat sink device of the invention with lateral compliance, and comprises a substrate 210 of a MCM device with semiconductor chips 220 terminating in chip contact patches 230. A thin thermally conductive flexible heat sink sheet 240 having lateral compliance extends in a plane over the chips 220 and is secured to chips 220 through chip contact patches 230 utilizing a TIM (not shown). Heat transfer elements (HTE) 260 such as fins, pins or other heat transfer structures are mounted on flexible heat sink sheet 240 having lateral compliance and support a thin thermally conductive flexible heat sink sheet 250 having lateral compliance that also extends in a plane above the MCM device. Flexible heat sink sheet 240 having lateral compliance HTE 260, flexible heat sink sheet 250 having lateral compliance, define channels 280 through which a cooling fluid or heat exchange fluid flows to carry away any heat developed in the MCM.

As noted before, thin top and bottom heat sink sheets 250 and 240 provide flexibility to accommodate tilted chips and level differences between chips. Adding lateral compliance features 270, i.e., bends to at least the bottom (chipside) sheet 240, and optionally sheet 250, allows for lateral expansion and contraction of the heat sink relative to the substrate without moving or significantly stressing the individual chip contact patches 230.

FIG. 3 comprises an illustration of a heat sink device of the invention with lateral compliance, and comprises a substrate 310 of a MCM device with semiconductor chips 320 terminating in chip contact patches 330. A thin thermally conductive heat sink sheet 340 extends in a plane over the chips 320 and is secured to chips 320 through chip contact patches 330 utilizing a TIM (not shown) Heat transfer elements (HTE) 360 such as fins, pins or other heat transfer structures are mounted on flexible heat sink sheet 340 having lateral compliance and support a thin thermally conductive sheet flexible heat sink sheet 350 having lateral compliance that also extends in a plane over the MCM device. Flexible heat sink sheet 340 having lateral compliance, HTE 360, and flexible heat sink sheet 350 having lateral compliance define channels 380 through which a cooling fluid or heat exchange fluid flows to carry away any heat developed in the MCM.

In one embodiment, the chips of the MCM structure, and the heat sink sheets extend in planes substantially parallel to one another.

Thin top and bottom heat sink sheets 350 and 340 provide flexibility to accommodate tilted chips and level differences between chips. Adding lateral compliance features 370, i.e., an elastomer to secure the facing, substantially parallel edges of adjoining separate heat sink sheets allows for lateral expansion and contraction of the heat sink relative to the substrate without moving or significantly stressing the individual chip contact patches.

Hawlev's Condensed Chemical Dictionary, $12^{th}$ Edition 1993, Hackh's Chemical Dictionary, Third Edition 1953, and Kirk-Othmer Encyclopedia of Chemical Technology, Second Edition, define "elastomers" as we use the term in this specification.

Figure 4:
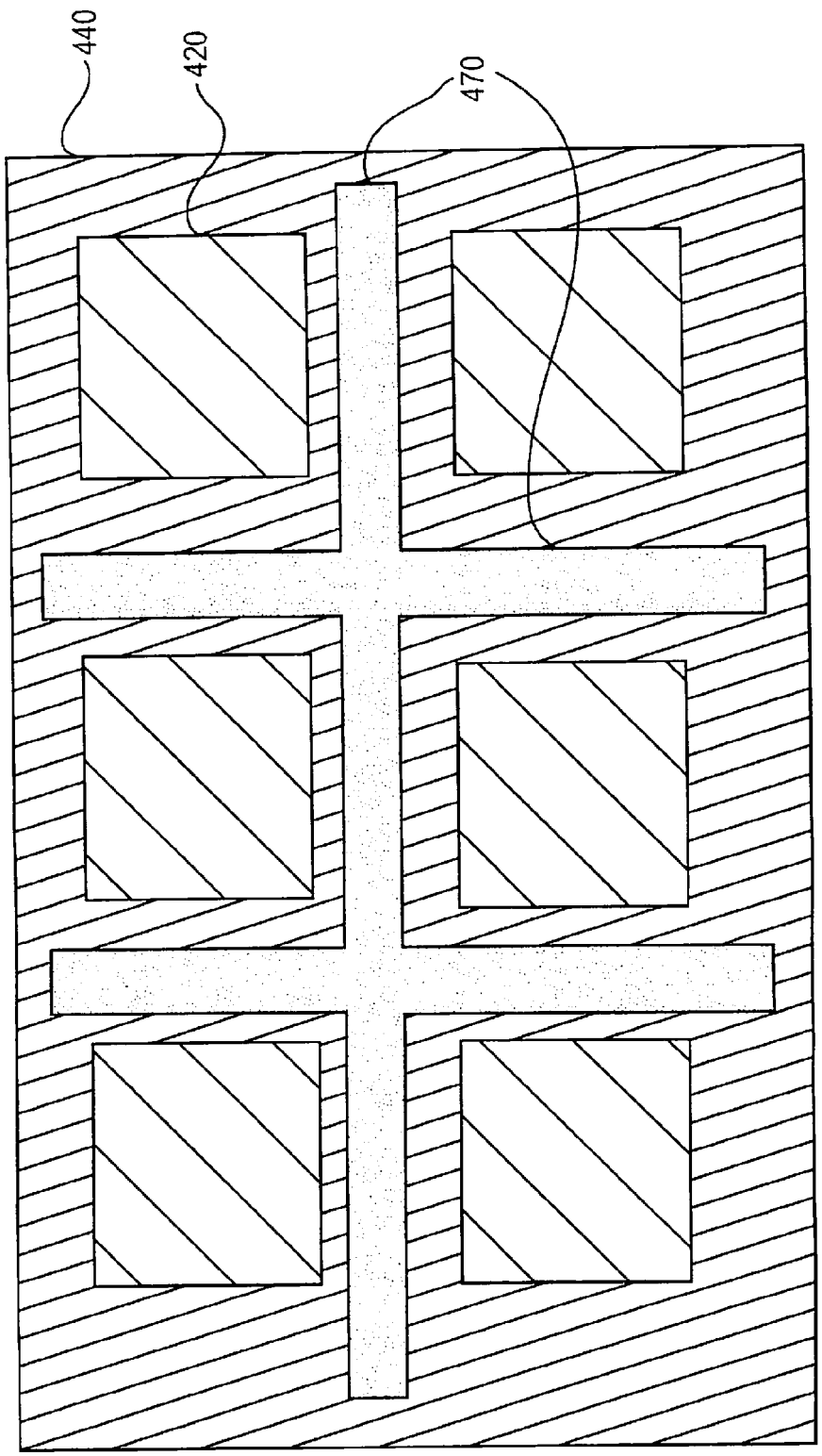
FIG. 4 Comprises a plan view of a cooling structure with the top cover removed illustrating the present invention comprising a structure for cooling an MCM where the structure comprises lateral compliance features between MCM components.

FIG. 4 comprises an illustration of a heat sink device of the invention with lateral compliance, and comprises a thin thermally conductive sheet heat sink sheet 440 that extends in a plane over chips in the device. Thin heat sink sheet 440 provides flexibility to accommodate tilted chips and level differences between chips. Lateral compliance features 470, i.e., bends in sheet 440 or an elastomer to secure the parallel edges of adjoining separate heat sink sheets as we describe in FIGS. 2 and 3, allows for lateral expansion and contraction of the heat sink relative to the substrate without substantially moving or substantially stressing the individual chip contact patches. These lateral compliance features will also serve to reduce the horizontal stiffness of the flexible heat sink.

FIG. 5 is an illustration of a prior art rigid cold plate assembly without lateral compliance consisting of a substrate 510 of a MCM device with semiconductor chips 520. A cold plate 590 connects to chip 520 in a heat exchange relation by means of heat exchange pistons 560 and TIM 570 and TIM 530.

Figure 6:
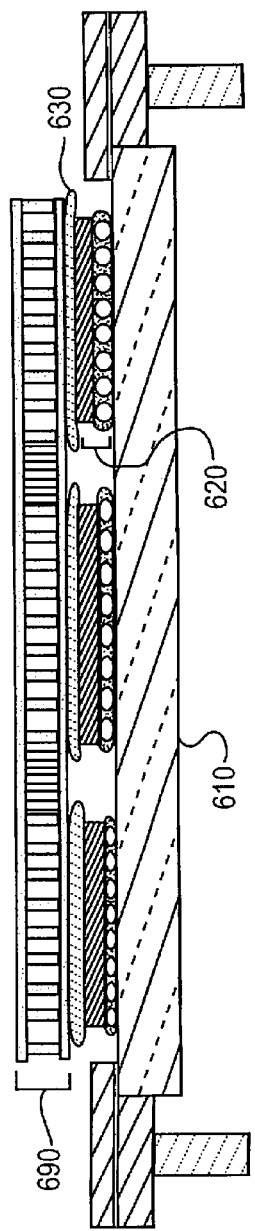
FIG. 6 Illustrates the present invention comprising a side elevation in cross-section of a structure for cooling an MCM and comprises a flexible, direct attach cold plate assembly associated with a cooling/chip structure as illustrated in FIG. 2.

By contrast, the present invention provides a flexible cold plate directly attached to a chip assembly as illustrated in FIG. 6 which illustrates a substrate 610 for a MCM assembly comprising chips 620 mounted on substrate 610 and secured by means of TIM 630 to a flexible heat sink 690 with lateral compliance which we also describe as a flexible cold plate. Heat sink 690 is substantially the same as the flexible heat sink we illustrate in FIG. 2 or FIG. 3 of this invention.

Figure 7:
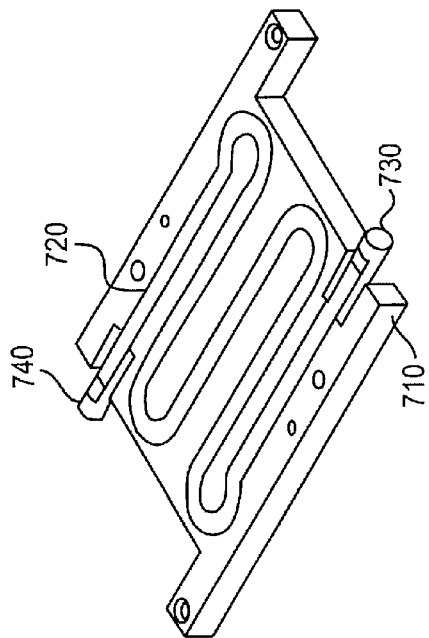
FIG. 7 Illustrates the present invention comprising an isometric projection of a structure for cooling an MCM with the top cover removed and comprises a bottom flexible plate with lateral compliance features and a number of heat transfer elements associated with the chips on the MCM.

FIG. 7 illustrates another aspect of the invention and comprises rigid cold plate base 710, coolant carrying tube 720, coolant Inlet 730, and Coolant outlet 740.

Figure 8:
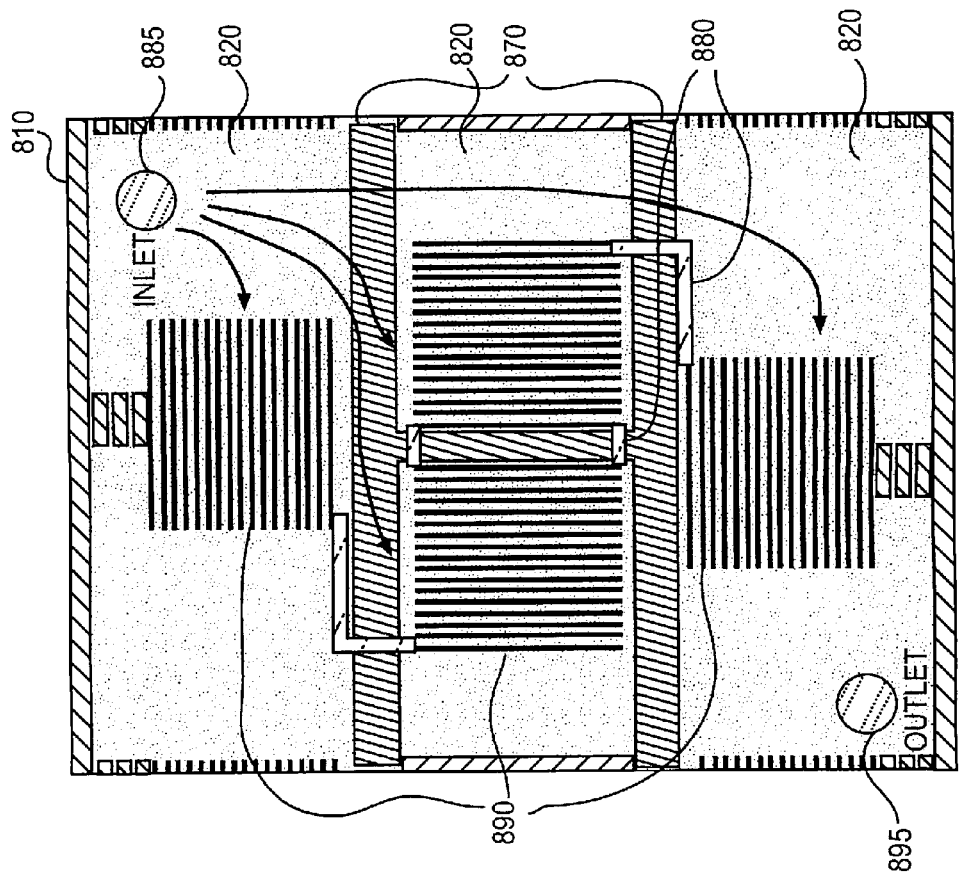
FIG. 8 Illustrates the present invention and comprises a plan view of a cooling apparatus with the top cover removed where the apparatus comprises a flexible cold plate design for cooling an MCM and incorporates parallel coolant feeds to a flexible cold plate structure where the structure includes lateral compliance features between MCM components.

FIG. 8 illustrates a baffle arrangement to provide parallel flow of coolant through a flexible cold plate of the invention and comprises a cold plate rim structure 810, top and bottom sheets 820, lateral compliance features 870 as illustrated in FIGS. 2 and/or 3, flow blockers 880 such as a plurality of fins substantially normal to the surface of at least one of the sheets 820, an inlet port 885, heat transfer elements (fins) 890, and outlet port 895.

Figure 9:
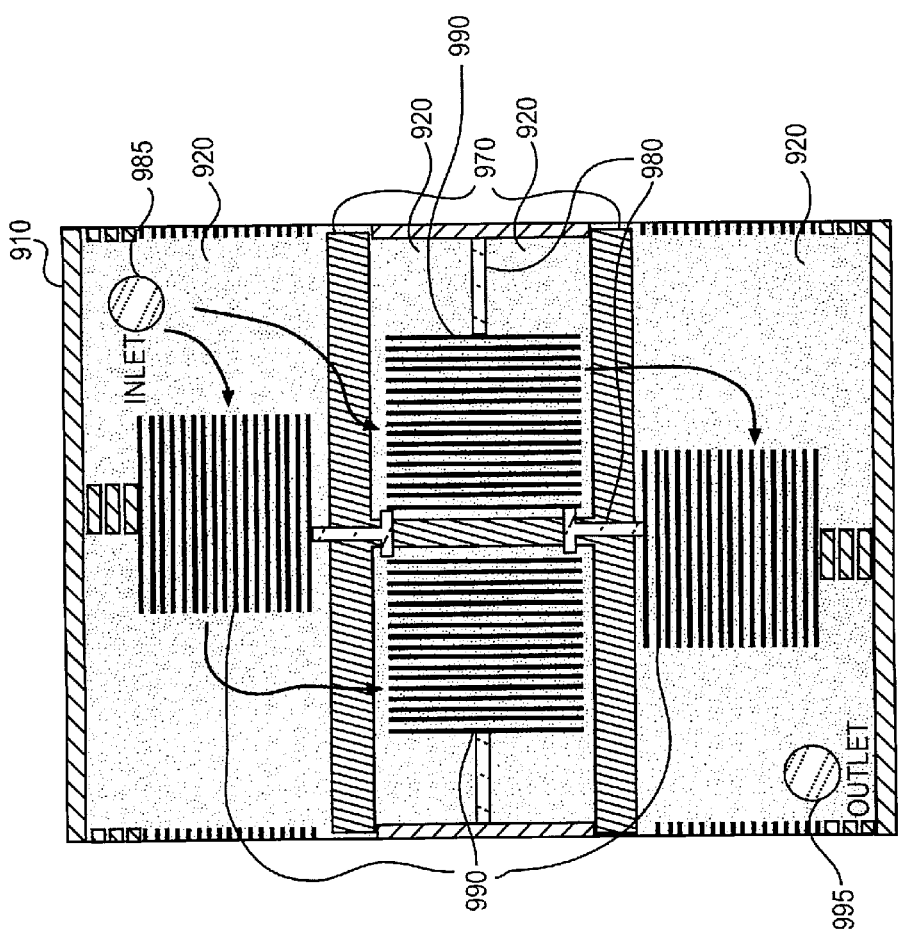
FIG. 9 Illustrates the present invention and comprises a plan view of a cooling apparatus with the top cover removed where the apparatus comprises a flexible cold plate design for cooling an MCM and incorporates seria/parallel coolant feeds to obtain higher velocity coolant flow to a flexible cold plate structure where the structure includes lateral compliance features between MCM components.

FIG. 9 illustrates a flexible cold plate design of the invention baffled to provide serial/parallel flow of a coolant through the flexible heat sink and comprises, a cold plate rim structure 910, top and bottom sheets 920, lateral compliance features 970 as illustrated in FIGS. 2 and/or 3, flow blockers 980 such as a plurality of fins substantially normal to at least one of the surface of sheets 920, inlet port 985, heat transfer elements (fins) 990, and outlet port 995.

In one embodiment, the multi-chip module (MCM) structure comprises more than one semiconductor chip lying in a first plane, the MCM having individual chip contact patches on the chips and a flexible heat sink having lateral compliance and extending in an unbroken second plane in the MCM and secured in a heat exchange relation to the chips through the contact patches, the MCM having a mismatch between the coefficient of thermal expansion of the heat sink and the MCM, the flexible heat sink with lateral compliance minimizing or eliminating shear stress and shear strain developed in the horizontal direction at the interface between the heat sink and the chip contact patches by allowing for substantial horizontal expansion and contraction of the heat sink relative to the MCM without moving the individual chip contact patches in a horizontal direction. The structure further comprises heat transfer elements (HTE) extending from the heat sink and opposite the contact patches on the heat sink and connecting to a second flexible heat sink lying in a third plane.

The second flexible heat sink may also have lateral compliance. Furthermore, the lateral compliance feature of the flexible heat sink may comprise a bend in the heat sink that extends away from the second plane, reverses direction, and then extends away from the second plane. Additionally, the feature comprising a bend in the second heat sink that extends away from the third plane, may reverse direction, and then extend away from the third plane.

The second heat sink of this MCM structure may comprise at least two of the second heat sinks having edges opposite one another lying in a common plane, and the lateral compliance feature comprises an elastomer joining the edges to one another.

Lastly, the flexible heat sink having lateral compliance and extending in a plane in the foregoing MCM structures may comprise a thermally conductive sheet.

Throughout this specification, and abstract of the disclosure, the inventors have set out equivalents, of various materials as well as combinations of elements, materials, compounds, compositions, conditions, processes, structures and the like, and even though set out individually, also include combinations of these equivalents such as the two component, three component, or four component combinations, or more as well as combinations of such equivalent elements, materials, compositions conditions, processes, structures and the like in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as applied to any claim or any parameters herein, such as a numerical value, including values used to describe numerical ranges, means slight variations in the parameter or the meaning ordinarily ascribed to these terms by a person with ordinary skill in the art. In another embodiment, the terms "about," "substantial," or "substantially," when employed to define numerical parameter include, e.g., a variation up to five per-cent, ten per-cent, or 15 percent, or somewhat higher.

All scientific journal articles and other articles, including internet sites, as well as issued and pending patents that this written description or applicants' Invention Disclosure Statements mention, including the references cited in such scientific journal articles and other articles, including internet sites, and such patents, are incorporated herein by reference in their entirety and for the purpose cited in this written description and for all other disclosures contained in such scientific journal articles and other articles, including internet sites as well as patents and the references cited therein, as all or any one may bear on or apply in whole or in part, not only to the foregoing written description, but also the following claims, and abstract of the disclosure.

Although we describe the invention by reference to some embodiments, other embodiments defined by the doctrine of equivalents are intended to be included as falling within the broad scope and spirit of the foregoing written description, and the following claims, abstract of the disclosure, and drawings.

We claim:

1. A multi-chip module (MCM) structure comprising more than one semiconductor chip lying in a first plane, said MCM having individual chip contact patches on said chips and a flexible heat sink having lateral compliance and extending in an unbroken second plane in said MCM and secured in a heat exchange relation to said chips through said contact patches, said MCM having a mismatch between the coefficient of thermal expansion of said heat sink and said MCM said flexible heat sink with lateral compliance minimizing or eliminating shear stress and shear strain developed in the horizontal direction at the interface between said heat sink and said chip contact patches by allowing for substantial horizontal expansion and contraction of said heat sink relative to said MCM without moving said individual chip contact patches in a horizontal direction, said structure further comprising heat transfer elements (HTE) extending from said heat sink and opposite said contact patches on said heat sink and connecting to a second flexible heat sink lying in a third plane.

2. The MCM structure of claim 1 wherein said second flexible heat sink comprises a flexible heat sink having lateral compliance.

3. The MCM structure of claim 1 wherein said lateral compliance feature of said flexible heat sink having lateral compliance comprises a bend in said heat sink that extends away from said second plane, reverses direction, and then extends away from said second plane.

4. The MCM structure of claim 2 wherein said lateral compliance feature of said second heat sink comprises a bend in said second heat sink that extends away from said third plane, reverses direction, and then extends away from said third plane.

5. The MCM structure of claim 2 wherein said second heat sink comprises at least two of said second heat sinks having edges opposite one another lying in a common plane, and said lateral compliance feature comprises an elastomer joining said edges to one another.

6. The MCM structure of claim 1 wherein said flexible heat sink having lateral compliance and extending in a plane comprises a thermally conductive sheet.

7. The MCM structure of claim 2 wherein said flexible heat sink having lateral compliance and extending In a plane comprises a thermally conductive sheet.

8. The MCM structure of claim 3 wherein said flexible heat sink having lateral compliance and extending in a plane comprises a thermally conductive sheet.

9. The MCM structure of claim 4 wherein said flexible heat sink having lateral compliance and extending in a plane comprises a thermally conductive sheet.

10. The MCM structure of claim 5 wherein said flexible heat sink having lateral compliance and extending in a plane comprises a thermally conductive sheet.

\* \* \* \* \*